(12) United States Patent
Hembree

(10) Patent No.: US 6,285,202 B1
(45) Date of Patent: *Sep. 4, 2001

(54) TEST CARRIER WITH FORCE APPLYING MECHANISM GUIDE AND TERMINAL CONTACT PROTECTOR

(75) Inventor: David R. Hembree, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 61 days.

(21) Appl. No.: 09/253,330

(22) Filed: Feb. 19, 1999

(51) Int. Cl.⁷ ..................................... G01R 31/02
(52) U.S. Cl. ............................................... 324/755
(58) Field of Search .................... 324/754, 755, 324/765; 437/8, 183, 189; 439/68, 71, 73, 266; 205/164

(56) References Cited

U.S. PATENT DOCUMENTS

| | | | |
|---|---|---|---|
| 4,969,828 | 11/1990 | Bright et al. .................. | 439/68 |
| 4,986,779 | 1/1991 | Ferrill et al. . | |
| 5,071,519 | * 12/1991 | Ferrill et al. .................. | 205/164 |
| 5,088,190 | 2/1992 | Malhi et al. .................. | 29/843 |
| 5,123,850 | 6/1992 | Elder et al. .................. | 439/67 |
| 5,322,446 | 6/1994 | Cearley-Cabbiness .......... | 439/73 |
| 5,367,253 | 11/1994 | Wood et al. ................ | 324/158.1 |
| 5,408,190 | 4/1995 | Wood et al. .................. | 324/765 |
| 5,424,652 | 6/1995 | Hembree et al. .............. | 324/765 |
| 5,451,165 | 9/1995 | Cearley-Cabbiness et al. ....... | 439/71 |
| 5,495,179 | 2/1996 | Wood et al. .................. | 324/755 |
| 5,519,332 | * 5/1996 | Wood et al. .................. | 324/755 |
| 5,530,376 | 6/1996 | Lim et al. .................. | 324/765 |
| 5,541,525 | 7/1996 | Wood et al. .................. | 324/755 |
| 5,559,444 | 9/1996 | Farnworth et al. .................. | 324/754 |
| 5,572,140 | 11/1996 | Lim et al. .............. | 324/755 |
| 5,578,934 | 11/1996 | Wood et al. .................. | 324/758 |
| 5,592,736 | 1/1997 | Akram et al. .................. | 29/842 |
| 5,634,267 | 6/1997 | Farnworth et al. .................. | 29/840 |
| 5,644,247 | 7/1997 | Hyun et al. .................. | 324/755 |
| 5,686,317 | 11/1997 | Akram et al. .................. | 437/8 |
| 5,691,649 | 11/1997 | Farnworth et al. .................. | 324/755 |
| 5,739,050 | 4/1998 | Farnworth .................. | 438/15 |
| 5,783,461 | 7/1998 | Hembree .................. | 438/17 |
| 5,796,264 | 8/1998 | Farnworth et al. .................. | 324/758 |
| 5,801,452 | 9/1998 | Farnworth et al. .................. | 257/797 |
| 5,815,000 | 9/1998 | Farnworth et al. .................. | 324/755 |
| 5,825,195 | 10/1998 | Hembree et al. .................. | 324/765 |
| 5,834,945 | 11/1998 | Akram et al. .................. | 324/755 |
| 5,844,418 | 12/1998 | Wood et al. .................. | 324/755 |
| 5,878,485 | 3/1999 | Wood et al. . | |
| 5,896,036 | 4/1999 | Wood et al. . | |
| 5,915,977 | 6/1999 | Hembree et al. . | |
| 5,929,647 | 6/1999 | Akram et al. . | |

(List continued on next page.)

Primary Examiner—Safet Metjahic
Assistant Examiner—Etienne P LeRoux
(74) Attorney, Agent, or Firm—Stephen A. Gratton

(57) ABSTRACT

A test carrier, a test method and a test system for semiconductor components are provided. The carrier includes a base, an interconnect for making temporary electrical connections with a component, and a force applying mechanism for biasing the component against the interconnect. The carrier also includes a guide mechanism for aligning the force applying mechanism during assembly of the carrier, and for protecting the force applying mechanism in the assembled carrier. The guide mechanism includes guide channels for engaging a clamp of the force applying mechanism, and slots for retaining tabs on the clamp. The carrier also includes a protector for protecting terminal contacts on the base, and for aligning the terminal contacts to mating contacts on a test board. The test method includes the step of assembling the carrier using the guide mechanism to align and attach the force applying mechanism to the base. The test system includes the carrier and the test board.

46 Claims, 5 Drawing Sheets

U.S. PATENT DOCUMENTS

| | | |
|---|---|---|
| 5,931,685 | 8/1999 | Hembree et al. . |
| 5,962,921 | 10/1999 | Farnworth et al. . |
| 5,982,185 | 11/1999 | Farnworth . |
| 6,016,060 | 1/2000 | Akram et al. . |
| 6,018,249 | 1/2000 | Akram et al. . |
| 6,025,728 | 2/2000 | Hembree et al. . |
| 6,025,731 | 2/2000 | Hembree et al. . |
| 6,040,702 | 3/2000 | Hembree et al. . |
| 6,060,893 | 5/2000 | Farnworth et al. . |
| 6,060,894 | 5/2000 | Hembree et al. . |
| 6,072,323 | 6/2000 | Hembree et al. . |
| 6,072,326 | 6/2000 | Akram et al. . |
| 6,091,251 | 6/2000 | Wood et al. . |
| 6,091,252 | 7/2000 | Akram et al. . |
| 6,094,058 | 7/2000 | Hembree et al. . |

\* cited by examiner

TEST CARRIER WITH FORCE APPLYING MECHANISM GUIDE AND TERMINAL CONTACT PROTECTOR

FIELD OF THE INVENTION

This invention relates generally to semiconductor manufacture and specifically to an improved test carrier, test system, and test method for testing semiconductor components, such as bare dice and chip scale packages.

BACKGROUND OF THE INVENTION

Semiconductor dice are being fabricated with increasing numbers of integrated circuits. As circuit integration increases, the sizes of semiconductor components are becoming smaller. Bare dice and chip scale packages can be only millimeters in length, and fractions of a millimeter in thickness. In addition, the external contacts on the components are becoming smaller and more closely spaced. For example, for fine ball grid array (FGBA) components, external contact balls can have a diameter as small as about 0.127 mm (0.005 inch), and a center to center pitch as small as about 0.228 mm (0.008 inch).

Typically, these types of components are tested using test carriers that mount to a test board. Exemplary test carriers are described in U.S. Pat. No. 5,844,418 to Wood et al.; U.S. Pat. No. 5,815,000 to Farnworth et al.; and U.S. Pat. No. 5,783,461 to Hembree.

As the components and external contacts on the components become smaller, making temporary electrical connections with the components for testing becomes more difficult. The test carrier includes an interconnect having contacts that make the temporary electrical connections with the external contacts on the components. In addition, the test carrier include a force applying mechanism that applies a biasing force for biasing the component against the interconnect. An exemplary force applying mechanism includes a biasing member, such as a metal or elastomeric spring for applying the biasing force, and a clamp or latch plate for securing the biasing member to a base of the carrier.

During assembly of the component into the carrier, the external contacts on the component are aligned with the contacts on the interconnect, and then placed in electrical contact therewith. One method of alignment is with an optical alignment system, as described in U.S. Pat. No. 5,634,267 to Wood et al. Another method of alignment is with a mechanical alignment system, as described in U.S. Pat. No. 5,559,444 to Farnworth et al.

Also during assembly of the carrier, the force applying member is attached to the base. One problem that occurs with the assembly of this type of carrier, is that although the component and the interconnect may be initially aligned, the force applying mechanism and carrier base may be misaligned. This misalignment can cause the contacts on the component and the interconnect to become misaligned, or can cause a shear load to be placed between the component and the interconnect. With small closely spaced contacts, any misalignment or loading can adversely affect, or prevent, the temporary electrical connections between the component contacts and the interconnect contacts.

One method for avoiding misalignment and loading by the force applying mechanism is disclosed in U.S. Pat. No. 5,739,050 to Farnworth. This method employs an assembly tool having a slide mechanism that allows the force applying mechanism to freely slide and self center relative to the base of the carrier. However, this method requires an assembly tool which may not be compatible with some assembly systems, or with some manual assembly techniques.

In addition to being misaligned during assembly, the force applying member can also move following assembly, causing misalignment or loading of the contacts. For example, the assembled test carriers must be transported and also loaded onto test boards, and can be bumped during these procedures. It would be desirable to provide a test carrier with a force applying member that can be aligned with the base during assembly of the carrier, and protected from movement following assembly of the carrier.

In addition to the force applying mechanism, the test carrier can also include terminal contacts on the carrier base, which are adapted for electrical connection to the test board. The terminal contacts typically comprise pins or contact balls. During assembly and handling of the carriers, the terminal contacts are unprotected, and subject to bending and deformation by other equipment. Bending and deformation is a particular problem during placement of the terminal contacts into engagement with mating contacts on the test board. It would be desirable to provide a test carrier with a protector for protecting the terminal contacts, and for aiding in the alignment of the terminal contacts to mating contacts on a test board.

SUMMARY OF THE INVENTION

In accordance with the present invention, a test carrier, a test system, and a test method for semiconductor components are provided. The test carrier can be used to temporarily package semiconductor components, such as bare dice and chip scale packages, for test and burn-in.

The carrier comprises: a base for retaining the component, an interconnect for making temporary electrical connections with the component, an alignment member for aligning the component to the interconnect, and a force applying mechanism for biasing the component against the interconnect. The carrier also includes a guide mechanism for aligning and attaching the force applying mechanism to the base during assembly of the carrier, and for protecting the force applying mechanism in the assembled carrier. In addition, the carrier includes a protector for protecting terminal contacts on the base, and for aligning the terminal contacts with mating contacts on a test board.

The force applying mechanism includes a clamp, a biasing member and a pressure plate, which are configured for use with an assembly tool. The assembly tool can be used to attach the force applying mechanism to the guide mechanism and base during assembly of the carrier. In illustrative embodiments the biasing member comprises an elastomeric spring, or alternately a metal leaf spring.

The guide mechanism includes guide channels that engage opposed sides of the clamp, tab slots that engage tabs on the clamp, and release slots that enable release of the tabs from the tab slots. The guide mechanism facilitates both manual and automated assembly of the carrier. In addition to aligning the force applying mechanism relative to the interconnect during assembly of the carrier, the guide mechanism protects and maintains alignment of the force applying mechanism, such that shear loads between the interconnect and component are substantially eliminated. The guide mechanism can be formed separately and attached to the base, or can be molded integrally with the base.

The protector can also be formed separately and attached to the base, or molded integrally with the base. In addition, the protector can include protective members formed along opposed edges of the base, or alternately can completely enclose a periphery of the base. In addition to protecting the terminal contacts on the base, the protector can provide alignment surfaces for engaging mating surfaces on the test board, to align the terminal contacts during mounting of the carrier to the test board.

The test method comprises the steps of: providing a test carrier comprising a base, an interconnect, a force applying mechanism and a guide mechanism; assembling the carrier with a semiconductor component therein; mounting the carrier to a test board; and then applying test signals through the carrier to the component. The assembly step comprises: holding the force applying mechanism and component using an assembly tool; aligning the component to the interconnect; aligning the force applying mechanism to the base using the guide mechanism; and then placing the component in contact with the interconnect while securing the force applying mechanism to the guide mechanism.

The test system comprises the test carrier, a test board for the test carrier, and test circuitry in electrical communication with the test board. The test circuitry is configured to apply test signals through the test board, and through the test carrier to the component.

DETAILED DESCRIPTION OF THE INVENTION

Figure 1:
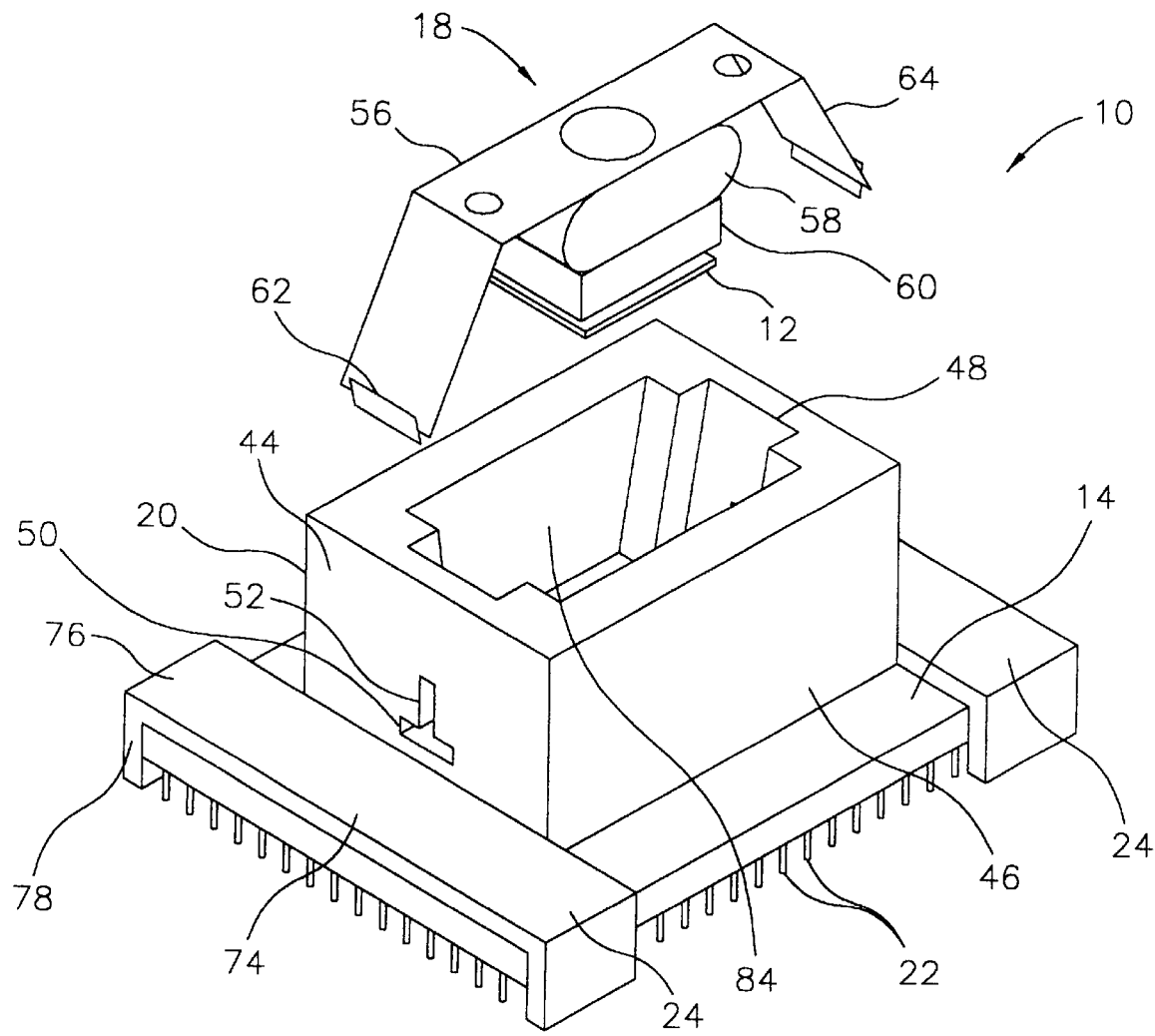
FIG. 1 is an exploded perspective view of a test carrier constructed in accordance with the invention.
Figure 2:
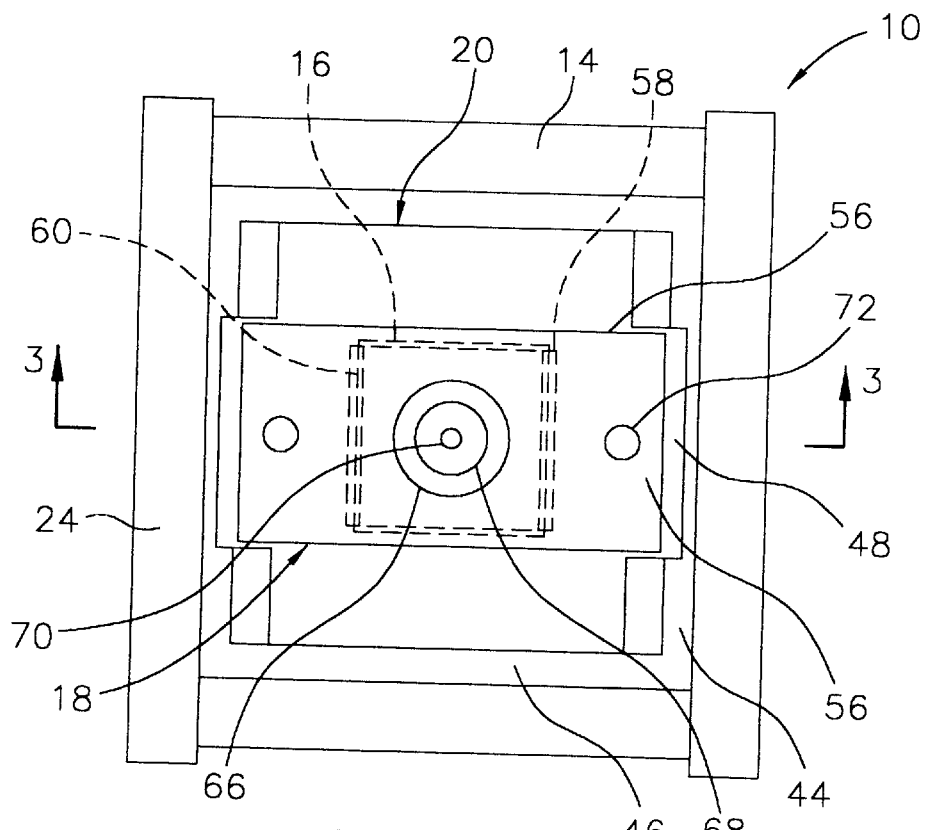
FIG. 2 is a plan view of the test carrier of FIG. 1.
Figure 3:
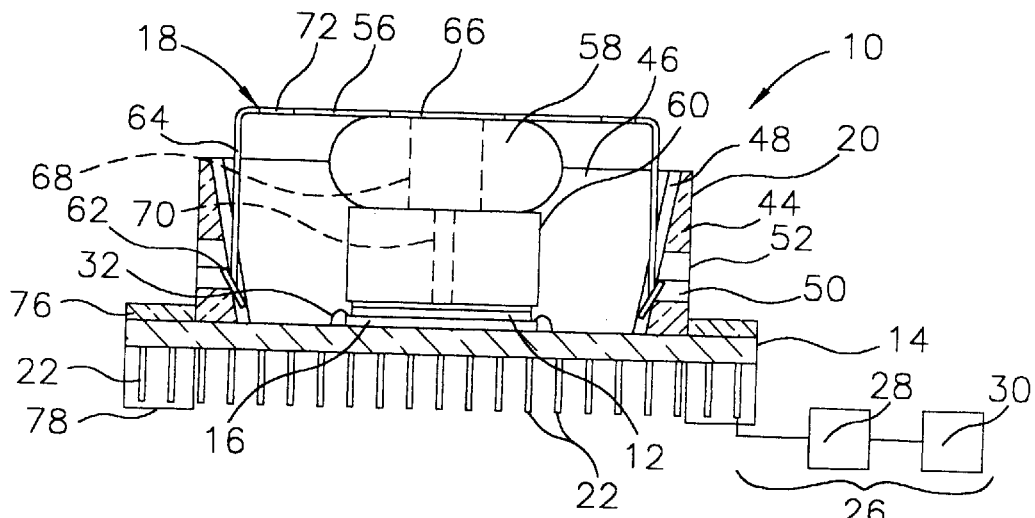
FIG. 3 is a schematic diagram of a test system constructed in accordance with the invention including a cross sectional view of the test carrier taken along line 3—3 of FIG. 2.

Referring to FIGS. 1–3, a test carrier 10 constructed in accordance with the invention is illustrated. The carrier 10 is adapted to temporarily package a semiconductor component 12 for testing and burn-in. In the illustrative embodiment, the component 12 includes contact balls 13 in electrical communication with integrated circuits contained on the component 12. The contact balls 13 are arranged in a ball grid array, as is conventional with BGA packages, chip scale packages and bumped bare dice. As will be further explained, the test carrier 10 can also be constructed to test components having planar contacts, such as thin film bond pads on a bare die.

The carrier 10, broadly stated, comprises: a base 14 for retaining the component 12; an interconnect 16 for making temporary electrical connections with the component 12; a force applying mechanism 18 for biasing the component 12 against the interconnect 16; a guide mechanism 20 for aligning and attaching the force applying mechanism 18 to the base 14; and a terminal contact protector 24 for protecting terminal contacts 22 on the base 14. The structure and function of these components will become more apparent as the description proceeds.

The base 14 provides a support structure for the other elements of the carrier 10. In addition, the base 10 in cooperation with the force applying mechanism 18, houses and retains the component 10. In the embodiment of FIGS. 1–3, the base 14 comprises a laminated ceramic material. A ceramic lamination process can be used to fabricate the base 14 with a desired geometry, and with metal features, such as internal conductors and external pads. U.S. Pat. No. 5,519,332 entitled "CARRIER FOR TESTING AN UNPACKAGED SEMICONDUCTOR DIE", which is incorporated herein by reference, describes a ceramic lamination process for fabricating the base 14.

Alternately, rather than ceramic, the base 14 can comprise plastic and the metal features formed using a 3-D molding process. U.S. patent application Ser. No. 08/615,119, now U.S. Pat. No. 5,878,485, filed Mar. 13, 1996, entitled "CARRIER FOR TESTING AN UNPACKAGED SEMICONDUCTOR DIE", which is incorporated herein by reference, describes a 3-D molding process for fabricating the base 14.

Rather than ceramic or plastic, the base 14 can also comprise a glass reinforced plastic (e.g., FR-4) similar to materials used for circuit boards. In this case, conventional plastic substrate fabrication processes, as described in *Ball Grid Array Technology*, by John H. Lau, McGraw-Hill, Inc., 1995, can be used for fabricating the base 14.

The terminal contacts 22 on the base 14 are adapted for electrical communication with a test board 28 (FIG. 2) and test circuitry 30 (FIG. 2). The test circuitry 30 generates test signals, and transmits the test signals to the terminal contacts 22, and through the interconnect 16 to the component 12. The test circuitry 30 also analyzes the resultant test signals transmitted from the component 12. The carrier 10, test board 28 and test circuitry 30 form a test system 26 (FIG. 2) which permits various electrical characteristics of the component 12 to be evaluated.

In the illustrative embodiment, the terminal contacts 22 on the base 14 comprise pins formed in a pin grid array (PGA) on a backside of the base 14. Alternately, other configurations for the terminal contacts 22 can be provided. For example, the carrier base 14 can include contact balls in a ball grid array (BGA), or fine ball grid array (FBGA). In addition, the base 14 includes internal conductors 35 (FIG. 5) in electrical communication with the terminal contacts 22 and with bond pads 34 (FIG. 5) on the base 14.

Figure 4:
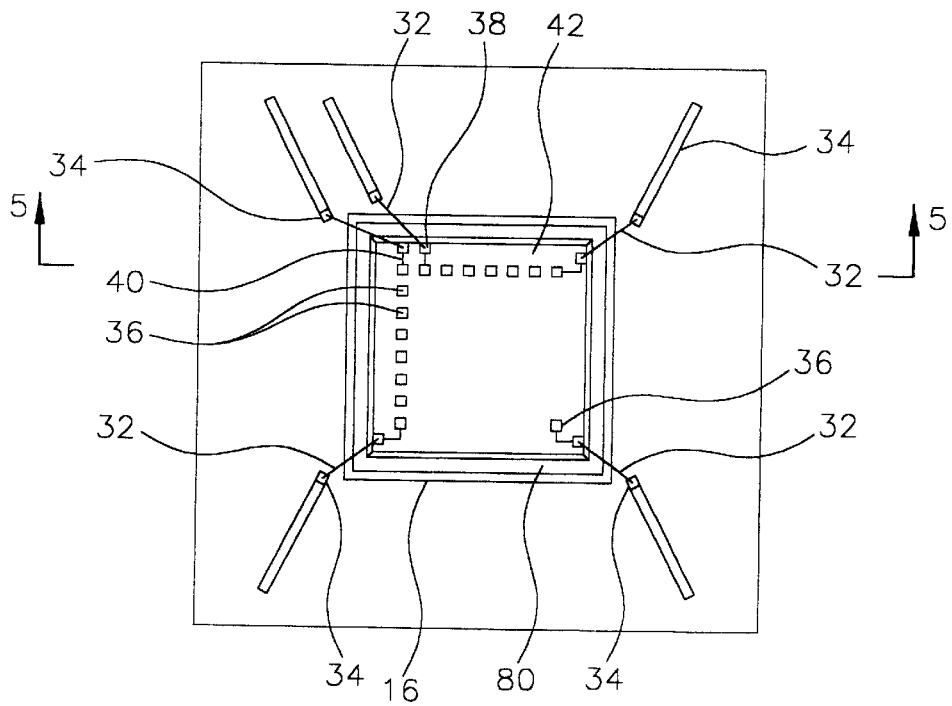
FIG. 4 is a plan view with parts removed of the base and interconnect of the test carrier of FIG. 1.

Referring to FIG. 4, the mounting of the interconnect 16 to the base 14 is shown schematically. The interconnect 16 includes patterns of interconnect contacts 36 configured to form temporary electrical connections with the contact balls 13 on the component 12. In addition, the interconnect 16 includes bond pads 38 formed along a periphery thereof, and conductors 40 electrically connecting the interconnect contacts 36 to the bond pads 38. Bond wires 32 are wire bonded to the bond pads 34 on the base 14, and to the bond pads 38 on the interconnect 16. The bond wires 32 complete the separate electrical paths between the terminal contacts 22 on the base 14, and the interconnect contacts 36 on the interconnect 16.

Figure 6A:
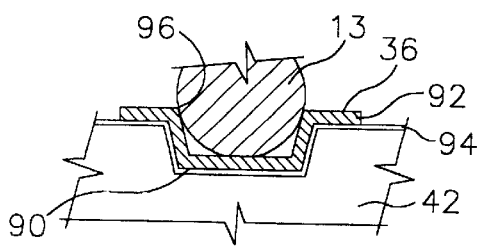
FIG. 6A is an enlarged schematic cross sectional view taken along section line 6A—6A of FIG. 5 illustrating an interconnect contact electrically engaging a component contact.

Referring to FIG. 6A, interconnect contact 36 is shown electrically engaging contact ball 13. The interconnect contact 36 can be formed integrally with a substrate 42 of the interconnect 16. Preferably, the substrate 42 comprises silicon, such that a coefficient of thermal expansion (CTE) of the interconnect 16 matches that of the semiconductor component 12 formed of silicon. Alternately, germanium, a reinforced glass resin material, or a ceramic material, can be used as the substrate material.

The interconnect contact 36, broadly stated, comprises: a pocket 90 in the interconnect substrate 42; a conductive layer 92 on the pocket 90; and an insulating layer 94 between the substrate 42 and conductive layer 92. One method for forming the pocket 90 is by forming a mask (not shown) on the interconnect substrate 42, such as a photo-patterned resist mask, and then etching the interconnect substrate 42 through openings in the mask, using an etchant. With the interconnect substrate 42 comprising silicon, a suitable etchant for performing the etch process comprises a solution of KOH.

The pocket 90 is sized and shaped to retain and electrically engage a single contact ball 13. A representative diameter, or width, of the pocket 90 can be from 2 mils to 50 mils or more. This diameter can be less than a diameter of the contact ball 13 so that only portions thereof will be contacted. A depth of the pocket 90 can be equal to or less than the diameter of the pocket 90. A pitch or spacing of the pocket 90 relative to adjacent pockets 90 will exactly match a pitch of the contact balls 13.

Still referring to FIG. 6A, the conductive layer 92 can comprise a layer of a highly conductive metal such as aluminum, titanium, nickel, iridium, copper, gold, tungsten, silver, platinum, palladium, tantalum, molybdenum or alloys of these metals. The conductive layer 92 can be formed on the insulating layer 94 to a desired thickness using a suitable metallization process (e.g., CVD, photopatterning, etching). Peripheral edges 96 of the conductive layer 92 are adapted to penetrate native oxide layers on the contact balls 13 to contact the underlying metal.

In addition, the conductive layer 92 is in electrical communication with a selected conductor 40 (FIG. 4) on the interconnect substrate 42 and with a selected terminal contact 22 on the base 14. The conductive layers 92 and conductors 40 can be formed using a same metallization process, or using different metalization processes. In addition, the conductive layers 92 and conductors 40 can be formed as multi-layered stacks of metals (e.g., bonding layer/barrier layer). Still further, the conductors 40 can be electrically insulated with an outer insulating layer (not shown).

Further details of the interconnect contact 36 are described in U.S. patent application Ser. No. 08/829,193, now U.S. Pat. No. 5,952,921, filed Mar. 31, 1997, entitled "INTERCONNECT HAVING RECESSED CONTACT MEMBERS WITH PENETRATING BLADES FOR TESTING SEMICONDUCTOR DICE AND PACKAGES WITH CONTACT BUMPS", incorporated herein by reference.

Figure 6B:
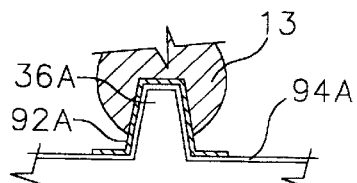
FIG. 6B is an enlarged schematic cross sectional view equivalent to FIG. 6A of an alternate embodiment interconnect contact.

Referring to FIG. 6B, a second embodiment interconnect contact 36A comprises a projection formed integrally with a substrate 42A, which preferably comprises silicon or other etchable material. One method for forming the interconnect contact 36A is by etching the substrate 42A as described in U.S. Pat. No. 5,483,741, entitled "METHOD FOR FABRICATING A SELF LIMITING SILICON BASED INTERCONNECT FOR TESTING BARE SEMICONDUCTOR DICE", which is incorporated herein by reference. The interconnect contact 36A includes a conductive layer 92A formed using a metallization process as previously described. The conductive layer 92A is in electrical communication with a selected conductor 40 (FIG. 4) on the substrate 42A. In addition, an insulating layer 94A can be formed on the substrate 42A to electrically insulate the conductive layer 92A.

The interconnect contact 36A is adapted to penetrate into the contact ball 13 to form an electrical connection therewith. In FIG. 6B, the interconnect contact 36A is shown as penetrating a center of the contact ball 13, forming a void therein. However, penetration can be along the peripheral edges of the contact ball 13 in which case a groove would be formed.

Figure 6C:
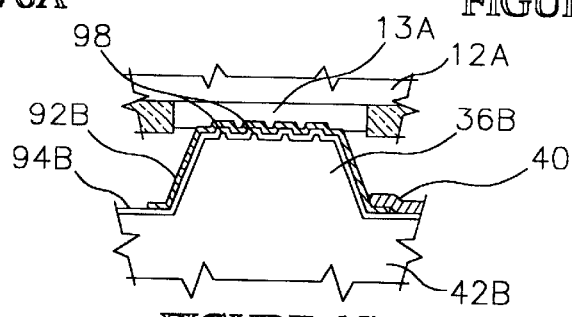
FIG. 6C is an enlarged schematic cross sectional view equivalent to FIG. 6A of an alternate embodiment interconnect contact and component contact.

Referring to FIG. 6C, a third embodiment interconnect contact 36B is adapted to electrically engage a component 12A, such as a bare die, having a planar contact 13A, such as a thin film bond pad. The interconnect contact 36B comprises a projection formed integrally with a substrate 42B. The interconnect contact 36B also includes penetrating projections 98 configured to penetrate the planar contact 13A to a limited penetration depth. In addition, the interconnect contact 36B includes a conductive layer 92B in electrical communication with a conductor 40 on the substrate 42B, and an insulating layer 94B for electrically insulating the conductive layer 92B. Further details of the interconnect contact 36B are described in U.S. Pat. No. 5,686,317, entitled "METHOD FOR FORMING AN INTERCONNECT HAVING A PENETRATION LIMITED CONTACT STRUCTURE FOR ESTABLISHING TEMPORARY ELECTRICAL COMMUNICATION WITH A SEMICONDUCTOR DIE", which is incorporated herein by reference.

In each of the above embodiments the contact balls 13 (or planar contact 13A) can be aligned with the interconnect contacts 36 using an optical alignment technique. Such an optical alignment technique is described in U.S. Pat. No. 5,796,264 which is incorporated herein by reference.

Figure 5:
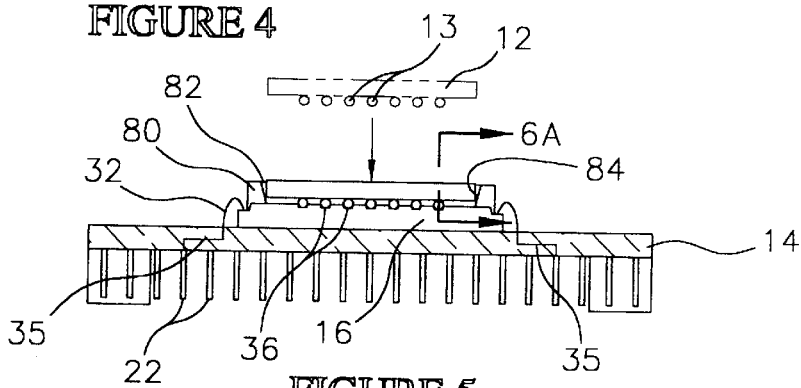
FIG. 5 is a schematic cross sectional view taken along section line 5—5 of FIG. 4 illustrating an optional alignment member during alignment of a semiconductor component.

Optionally, as shown in FIG. 5, an alignment member 80 can be used to align the component 12 to the interconnect 16. The alignment member 80 is adapted to align the component 12 with the interconnect 16, such that the contact balls 13 electrically engage the interconnect contacts 36. The alignment member 80 can comprise silicon, ceramic, plastic, or FR-4. The alignment member 80 includes an alignment opening 82 having a peripheral outline that is slightly larger than a peripheral outline of the component 12. The alignment opening 82 includes sloped sidewalls, adapted to contact the outside edges of the component 12, to guide the component 12 onto the interconnect 16. In FIG. 5, the alignment member 80 is illustrated as being attached to the interconnect 16. However, the alignment member 80 can also be attached to the base 14, or formed integrally therewith. A suitable method for forming a silicon alignment member is described in U.S. Pat. No. 5,559,444, entitled "METHOD AND APPARATUS FOR TESTING UNPACKAGED SEMICONDUCTOR DICE", incorporated herein by reference.

Referring again to FIGS. 1–3, the force applying mechanism 18 for the carrier 10 is shown. The force applying mechanism 18, broadly stated, comprises: a clamp 56, a biasing member 58, and a pressure plate 60. The clamp 56 comprises a flexible bridge-like structure formed of a resilient material such as steel. The clamp 56 includes opposed sides 64 movable towards one another. The clamp 56 also includes tabs 62 that physically engage tab slots 50 on the guide mechanism 20. Additionally, the clamp 56 includes an opening 66 which provides access to the component 12 for a vacuum assembly tool 100 (FIG. 9B) during assembly of the carrier 10. The biasing member 58 also includes an opening 68, and the pressure plate 60 includes an opening 70 for the vacuum assembly tool 100 (FIG. 9B). A pair of openings 72 (FIG. 2) are also provided on the clamp 56 for the manipulation of the clamp 56 by the vacuum assembly tool 100 (FIG. 9B) during assembly of the carrier 10.

In the embodiment illustrated in FIG. 1, the biasing member 58 comprises an elastomeric spring. Representative materials for the biasing member 58 include elastomeric polymers such as silicone, butyl rubber, flourosilicone, and polyimide. If desired, the biasing member 58 can be attached to the clamp 56 using an adhesive such as a silicone adhesive. For some applications in which an electrical path through the biasing member 58 is required (e.g., ground path), the elastomeric polymer can include carbon or metal conductive particles. A representative hardness of the biasing member 58 can be from about 30–90 (Shore A), with preferably about 60–70 (Shore A).

Figure 1A:
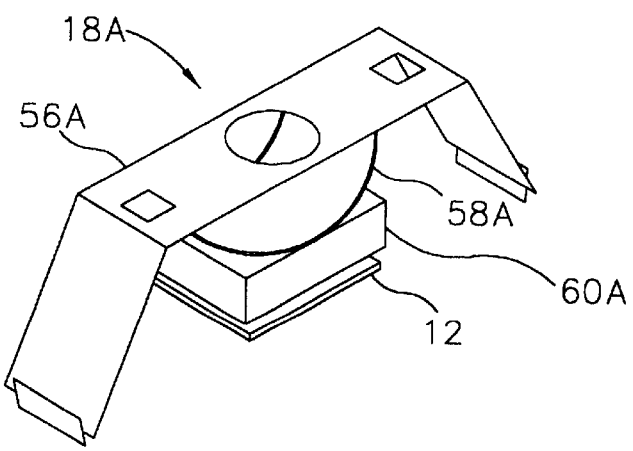
FIG. 1A is a perspective view of an alternate embodiment force applying mechanism for the test carrier.

Alternately, as shown in FIG. 1A, an alternate embodiment force applying mechanism 18A includes a biasing member 58A which comprises a metal leaf spring. In addition, the biasing member 58A includes a clamp 18A and a pressure plate 60A.

Referring again to FIG. 1, the pressure plate 60 has a block like configuration and a peripheral outline which corresponds to, but is slightly larger than a peripheral outline of the component 12. Preferred materials for the pressure plate 60 include metal, plastic, and conductive polymers. If desired, the pressure plate 60 can be attached to the biasing member 58 using an adhesive, such as a silicone adhesive. Also for some applications, the pressure plate 60 can be eliminated, such that the biasing member 58 directly contacts the component 12.

The guide mechanism 20 is constructed for interaction with the force applying mechanism 18 to align the force applying mechanism 18 with respect to the base 14 and interconnect 16. In the embodiment illustrated in FIGS. 1–3, the guide mechanism 20 can be formed separately, and then attached to the base 14. Preferred materials for the guide mechanism 20 include metal and plastic. Depending on the material, suitable methods of attachment include brazing, soldering or by applying an adhesive. In an embodiment to be hereinafter described, a guide mechanism 20A (FIG. 7) can be formed integrally with a base 14A using a molding process.

The guide mechanism 20 includes parallel, spaced sidewalls 44 and parallel spaced end walls 46. The sidewalls 44 and end walls 46 extend perpendicular to the plane of the base 14, and form a rectangular, frame-like structure. The sidewalls and end walls 46 form a cavity 84 sized to substantially enclose the force applying mechanism 18 in the assembled carrier 10. In addition, the sidewalls 44 include opposed guide channels 48, located within the cavity 84, and extending transverse to the plane of base 14. The guide channels 48 incline inward toward each other as the guide channels 48 approach the base 14, so that the distance between the guide channels 48 is smallest at the base 14. A through tab slot 50 extends from each guide channel 48 parallel to the plane of the base 14 through the respective sidewall 44. A through release slot 52 extends through each sidewall 44 and connects to the tab slot forming an inverted T shape. The tab slots 50 secure the force applying mechanism 18 to the carrier 10. The release slots 52 allow release of the force applying mechanism 18 from the carrier 10, in a manner to be hereinafter described.

The guide channels 48, and the sides 64 of the clamp 56, are sized and shaped such the clamp 56 can be guided into a precise position relative to the base 14 and the interconnect 16. The guide channels 48 thereby align the force applying mechanism 18 with the base 14 and the interconnect 16. In addition, the distances between the guide channels 48, and between the sides 64 of the clamp 56, are selected such that, as the clamp 56 moves toward the base 14, the sides 64 move towards one another. Accordingly the tabs 62 on the clamp 56 can engage the tab slots 50 in the guide mechanism 20, with the resiliency of the clamp 56 providing positive engagement of the tabs 62 in the tab slots 50. The force applying mechanism 18 can be released from the guide mechanism 20 by inserting a tool 112 (FIG. 9E) through the release slots 52 and pushing the sides 64 inward with the tool 112 to disengage the tabs 62 from the tab slots 50.

With the guide mechanism 20 aligning the force applying mechanism 18 alignment of the component 12 to the interconnect 16, assembly of the carrier 10 is facilitated. In addition to performing an alignment function during assembly of the carrier 10, the guide mechanism 20 also protects the force applying mechanism 18 from movement following assembly. This helps to preserve the alignment of the component 12 to the interconnect 16. In addition, shear loads between the contact balls 13 and interconnect contacts 36, as would occur with movement of the force applying mechanism 18 are substantially eliminated. Preferably the height of the guide mechanism 20 and size of the cavity 84, are selected such that an external optical viewing device can be used to view the component 12 and the interconnect 16 during optical alignment thereof. Also for some applications, openings (not shown) can be provided in the guide mechanism 20 to permit viewing of the component 12 and the interconnect 16 for optical alignment.

Still referring to FIGS. 1–3, the terminal contact protector 24 for the carrier 10 includes parallel, spaced protective members 74 mounted along opposed sides of the base 14. Preferred materials for the protector 24 include metal and plastic. Each protective member 74 of the protector 24 comprises a rigid bridge-like structure with a base member 76 and legs 78 at opposite ends thereof. Depending on the material, the base member 76 can be attached to the base 14 by brazing, soldering or with an adhesive. The legs 78 of the protective members 74 project in a z-direction past the ends of base 14 and past the terminal contacts 22. Accordingly, with the carrier 10 placed on a flat surface, the carrier 10 will rest on the legs 78. This geometry can be used to protect the terminal contacts 22 on the base 14 during assembly and subsequent handling of the carrier 10. In addition, as will be further explained, a peripheral geometry of the protector 24 can be used to provide alignment of the terminal contacts 22 during mounting of the carrier 10 to the test board 28.

Figure 7:
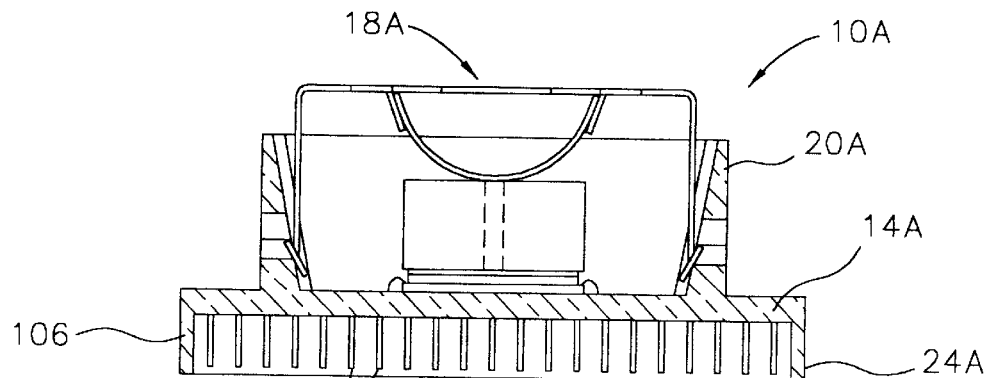
FIG. 7 is a schematic cross sectional view equivalent to the cross sectional view contained in FIG. 3 of an alternate embodiment test carrier.

Referring to FIG. 7, an alternate embodiment carrier 10A is shown. The carrier 10A includes essentially the same elements as previously described for carrier 10 (FIGS. 1–3), and includes previously described force applying mechanism 18A. However, in this embodiment a base 14A, a guide mechanism 20A, and a protector 24A for the carrier 10 comprise a unitary structure formed using a molding process. In addition, the protector 24A surrounds the terminal contacts 22A and is constructed with a periphery adapted for mating engagement with a groove 102 (FIG. 8B) on the test board 28.

A preferred material for the base 14A, guide mechanism 20A and protector 24A comprises plastic, such as a thermoplastic plastic, a thermosetting plastic or a liquid crystal polymer. Exemplary materials include polyetherimide (PEI) and polyphenyl sulfide (PPS). In addition, a 3D molding process, as described in previously cited U.S. Pat. No. 5,878,485 can be used to fabricate the carrier 10A with a required geometry, and with features such as internal and external conductors. In addition, the terminal contacts 22A can be molded integrally with the base 14A, or attached using a suitable process such as brazing, welding or soldering.

Figure 8A:
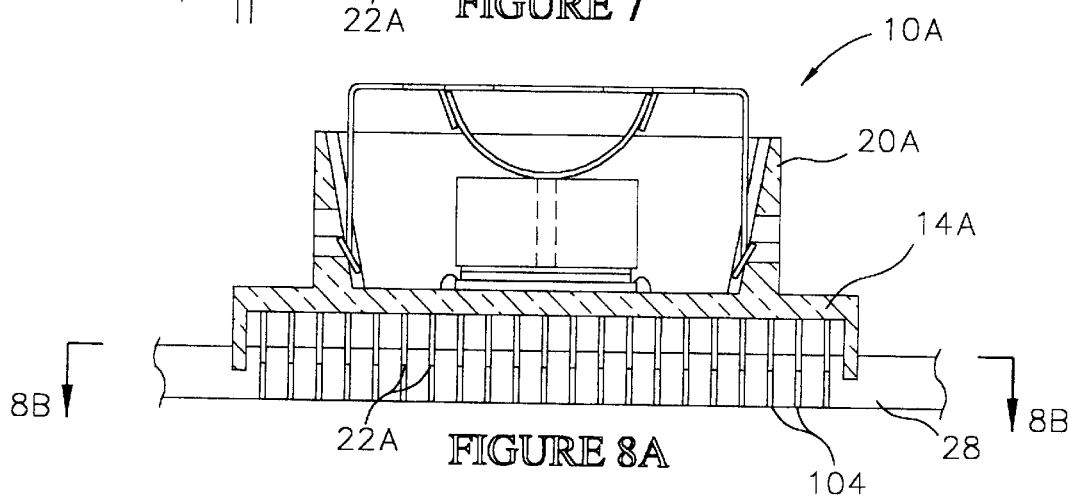
FIG. 8A is a schematic cross sectional view of the alternate embodiment test carrier mounted to a test board.
Figure 8B:
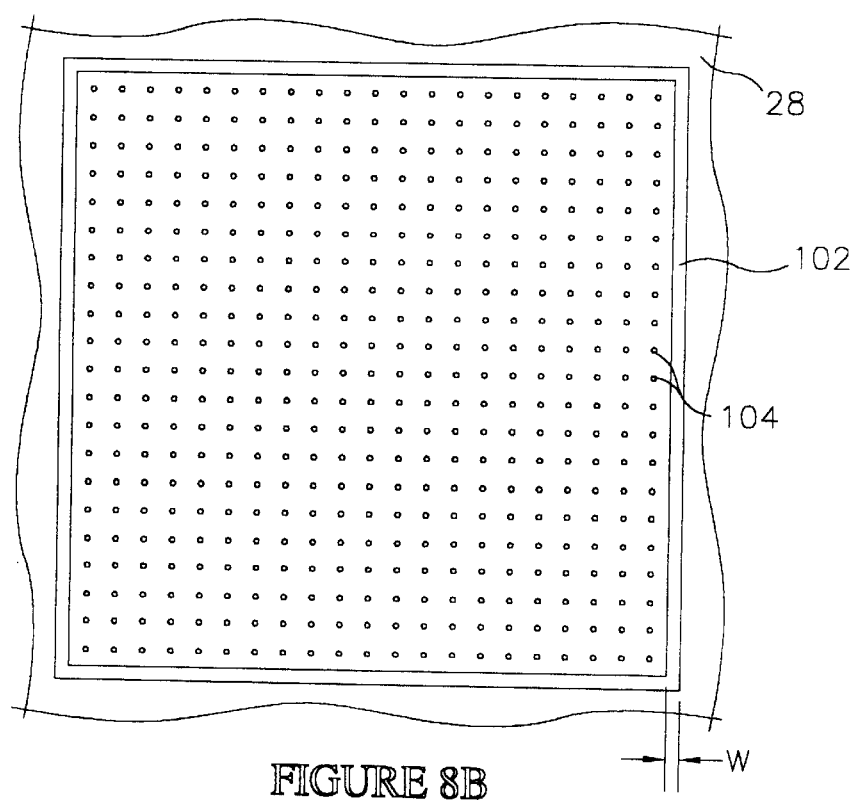
FIG. 8B is a view taken along section line 8B—8B of FIG. 8A illustrating electrical connectors and a guide channel on the test board.

Referring to FIGS. 8A and 8B, an alignment function of the protector 24A is illustrated. As previously stated, a periphery of the protector 24A is adapted for mating engagement with the groove 102 (FIG. 8B) on the test board 28. Accordingly a peripheral outline of the protector 24A and of the groove 102 are about the same, with the groove 102 being slightly larger. In addition, side flanges 106 on the protector 24A have a thickness T (FIG. 7) that is about the same as a width W (FIG. 8B) of the groove 102, with the groove 102 being slightly larger.

The test board also 28 includes electrical connectors 104 adapted for mating electrical engagement with the terminal contacts 22A. The electrical connectors 104 are in electrical communication with the test circuitry 30 (FIG. 3). As the carrier 1OA is placed on the test board 28, mating engagement of surfaces on the protector 24A and groove 102 align the terminal contacts 22A to the connectors 104. This allows the terminal contacts 22A to be inserted into the connectors 104 without bending and distortion.

Referring to FIGS. 9A–9E, the steps included in a method for testing the semiconductor component 12 using the test carrier 10 are shown.

Figure 9A:
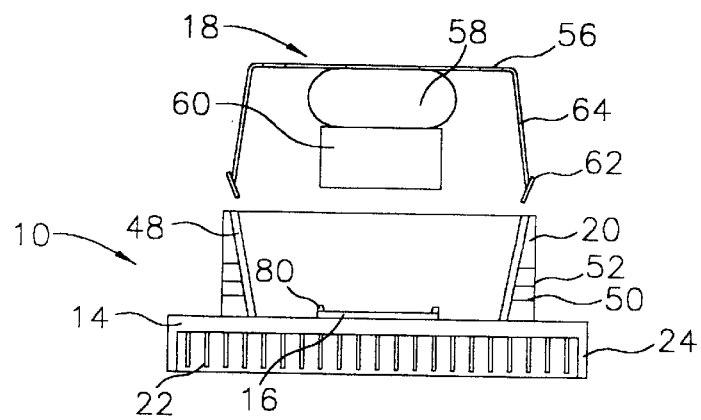
FIGS. 9A–9E are schematic cross sectional views illustrating a test method performed using the test carrier of FIGS. 1–3.
Figure 9B:
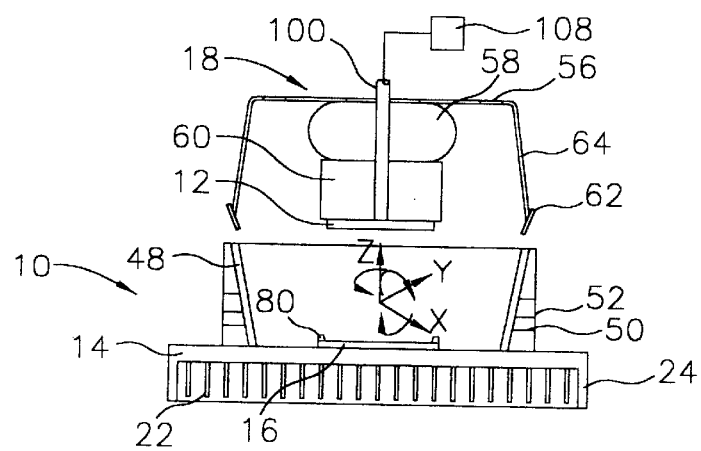

Initially, as shown in FIG. 9A, the test carrier 10 is provided. The test carrier 10 comprises the base 14, the interconnect 16, the force applying mechanism 18, the guide mechanism 20, and the alignment member 80.

Next, as shown in FIG. 9B, the vacuum assembly tool 100 is provided in flow communication with a vacuum source 108. The assembly tool 100 is adapted to simultaneously hold the component 12 and the force applying mechanism 18. In addition, the assembly tool 100 is movable in X, Y and Z directions, and in rotational directions about the X, Y and Z axis. In a manual system movement of the assembly tool can be accomplished by the operator. In an automated system such as described in previously cited U.S. Pat. No. 5,796,264 control of the assembly tool 100 can be automated. In addition, in an automated system an optical alignment system can be coupled to the assembly tool 100 to align the component 12 to the interconnect 16. In this case the alignment member 80 would not be required.

Figure 9C:
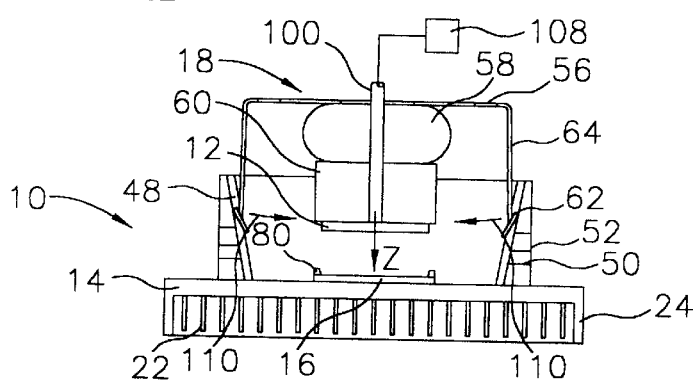

Next, as shown in FIG. 9C, the sides 64 and tabs 62 of the clamp 56 are slid along the guide channels 48 of the guide mechanism 20, as the force applying mechanism 18 and component 12 are moved in the z-direction towards the interconnect 16. The inward slope of the guide channels 48 moves the sides 64 of the clamp towards one another as indicated by arrows 110. In addition, the guide channels 48 maintain the alignment of the force applying mechanism 18 relative to the interconnect 16 and base 14.

Figures 9D, 9E:
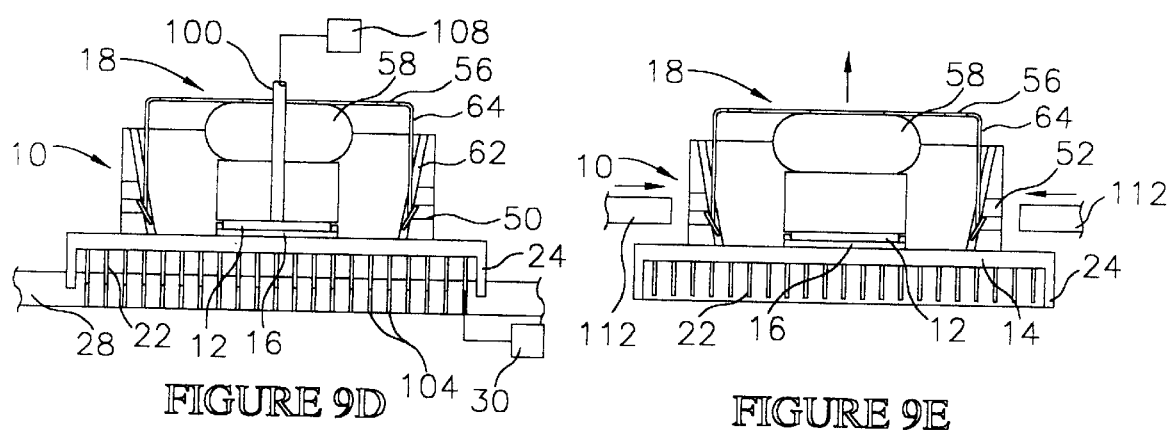

Next, as shown in FIG. 9D, the component 12 is placed in physical contact with the interconnect 16. If optical alignment is not employed, the alignment member 80 aligns the component to the interconnect 16 such that the contact balls 13 (FIG. 6A) electrically engage the interconnect contacts 36 (FIG. 6A). At the same time that the component 12 is placed on the interconnect 16, the tabs 62 physically engage the tab slots 50 in the guide mechanism 20. In addition, the biasing member 58 is compressed such that a biasing force is applied for biasing the component 12 against the interconnect 16. Removal of the assembly tool 100 completes the assembly of the carrier 10. During the assembly process the terminal contacts 22 on the base 14 are protected by the protective member 74.

As also shown in FIG. 9D, the assembled carrier 10 is placed on the test board 28 with the terminal contacts 22 in electrical communication with the test circuitry 30. Placement of the carrier 10 on the test board 28 can be manually or with an automated system. During placement of the carrier 10 on the test board 28 the protector 24 can perform an alignment function as previously described to align the terminal contacts 12 to the electrical connectors 104 (FIG. 8B). With the carrier 10 mounted to the test board 28, test signals can be applied by the test circuitry 30 through the carrier 10 to the component 12, for testing the integrated circuits contained on the component 12.

Following testing, and as shown in FIG. 9E, the carrier 10 can be removed from the test board 28. Disassembly of the carrier 10 can be accomplished by placing the disassembly tool 112 in the release slots 52, while moving the sides 64 of the clamp 56 inward, and moving the force applying mechanism 18 away from the base 14. If desired, the assembly tool 100 can be used in conjunction with the disassembly tool 112 during the disassembling process.

Thus the invention provides an improved test carrier, test system and test method for semiconductor components. Although the invention has been described with a certain degree of particularity, it is understood that the present disclosure has been made by way of example and that changes in details of structure may be made without departing from the spirit thereof.

What is claimed is:

1. A test carrier for a semiconductor component having a plurality of first contacts comprising:
   a base;
   an interconnect on the base comprising a plurality of second contacts configured to make temporary electrical connections with the first contacts on the component;
   a force applying mechanism comprising a clamp having opposed sides, tabs on the sides, and a spring on the clamp configured to bias the component and the interconnect together; and
   a guide mechanism on the base comprising opposed channels configured to align the clamp on the base as the clamp is slid along the channels and to move the sides of the clamp towards one another, and a pair of slots proximate to the channels configured to engage the tabs to attach the clamp to the guide mechanism.

2. The test carrier of claim 1 wherein the guide mechanism substantially encloses the force applying mechanism following attachment of the tabs to the slots.

3. The test carrier of claim 1 wherein the base and the guide mechanism comprise a molded plastic structure.

4. The test carrier of claim 1 wherein the base comprises a plurality of terminal contacts in electrical communication with the second contacts on the interconnect and a protector for protecting the terminal contacts.

5. A test carrier for a semiconductor component having a plurality of first contacts comprising:
   a molded plastic base;
   an interconnect on the base comprising a plurality of second contacts configured to make temporary electrical connections with the first contacts on the component;
   a force applying mechanism comprising a clamp having opposed sides and a spring configured to bias the component and the interconnect together; and
   a guide mechanism molded on the base configured to form a unitary structure comprising opposed channels configured to engage the sides of the clamp during assembly of the test carrier to align the force applying mechanism on the base.

6. The test carrier of claim 5 wherein the channels are configured to move the sides towards one another to attach the clamp to the guide mechanism.

7. The test carrier of claim 6 wherein the sides of the clamp comprises tabs and the guide mechanism comprises a slot proximate to each channel configured to retain the tabs to attach the force applying mechanism to the base.

8. The test carrier of claim 7 wherein the guide mechanism comprises a second slot proximate to each channel configured to release the tabs.

9. The test carrier of claim 7 wherein the base comprises a plurality of terminal contacts in electrical communication with the second contacts and a molded protector for protecting the terminal contacts.

10. A test carrier for a semiconductor component having a plurality of first contacts comprising:
    an interconnect comprising a plurality of second contacts configured to make temporary electrical connections with the first contacts on the component;
    a force applying mechanism comprising a clamp having opposed sides, tabs on the sides, and a spring configured to bias the component against the interconnect; and
    a base comprising a guide mechanism configured to align the force applying mechanism on the base during assembly of the carrier and to protect the force applying mechanism following assembly of the carrier, the guide mechanism comprising opposed guide channels configured to align the clamp on the base as the clamp is slid along the channels and to move the sides of the clamp towards one another, and a pair of slots proximate to the channels configured to engage the tabs to attach the clamp to the guide mechanism.

11. The test carrier of claim 10 wherein the guide mechanism comprises a cavity configured to substantially enclose the force applying mechanism.

12. The test carrier of claim 10 wherein the guide mechanism comprises a separate element attached to the base.

13. The test carrier of claim 10 wherein the guide mechanism and the base comprise plastic molded to form a unitary structure.

14. The test carrier of claim 10 wherein the guide mechanism comprises a second slot proximate to each channel configured to release the clamp during disassembly of the carrier.

15. A test carrier for a semiconductor component having a plurality of first contacts comprising:
    a base;
    an interconnect on the base comprising a plurality of second contacts configured to make temporary electrical connections with the first contacts on the component;
    a force applying mechanism comprising a clamp having opposed sides with tabs thereon, and a spring attached to the clamp configured to bias the component against the interconnect; and
    a guide mechanism on the base comprising opposed guide channels configured to engage the clamp to align the force applying mechanism on the base, the guide channels including first slots configured to retain the tabs to attach the clamp to the guide mechanism and second slots configured to release the tabs for separating the clamp from the guide mechanism.

16. The test carrier of claim 15 wherein the guide channels are inclined towards one another for moving the sides of the clamp towards one another during assembly of the carrier.

17. The test carrier of claim 15 wherein the second slots are generally perpendicular to the first slots.

18. A test carrier for a semiconductor component comprising:
    a base comprising a guide mechanism having opposed guide channels, the base and the guide mechanism formed as unitary molded plastic structure;
    an interconnect on the base configured to make temporary electrical connections with the component; and
    a force applying mechanism attachable to the base comprising a clamp having opposed sides and a spring attached to the clamp configured to bias the component against the interconnect, the sides insertable into the guide channels during assembly of the carrier to align the force applying mechanism on the base.

19. The test carrier of claim 18 wherein the sides of the clamp comprise tabs and the guide channels comprise slots for retaining the tabs to attach the clamp to the guide mechanism.

20. The test carrier of claim 18 wherein the base comprises a plurality of terminal contacts and a protector substantially enclosing and protecting the terminal contacts.

21. The test carrier of claim 18 wherein the guide mechanism comprises a cavity for substantially enclosing the force applying mechanism.

22. A test carrier for a semiconductor component having a plurality of first contacts comprising:
    a base comprising a plurality of terminal contacts and a protector configured to protect the terminal contacts;
    an interconnect on the base comprising a plurality of second contacts in electrical communication with the terminal contacts configured to electrically engage the first contacts on the component;
    a guide mechanism on the base comprising opposed inclined guide channels and slots proximate to the guide channels; and
    a force applying mechanism comprising a biasing member for biasing the component against the interconnect, and a clamp comprising opposed sides each having a tab;
    the guide channels configured to engage the sides to align the force applying mechanism on the base, the tabs configured to engage the slots to secure the force applying mechanism to the base.

23. The test carrier of claim 22 wherein the guide channels include second slots for releasing the tabs during disassembly of the carrier.

24. The test carrier of claim 22 wherein the guide mechanism comprises a cavity for substantially enclosing the force applying mechanism.

25. The test carrier of claim 22 wherein the base, the protector and the guide mechanism comprise a molded plastic unitary structure.

26. A test carrier for a semiconductor component comprising:
   a base comprising a plurality of terminal contacts;
   an interconnect on the base in electrical communication with the terminal contacts and configured to make temporary electrical connections with the component;
   a terminal contact protector on the base for protecting the terminal contacts;
   a force applying mechanism on the base comprising a clamp having opposed sides, tabs on the sides, and a spring on the clamp configured to bias the component and the interconnect together; and
   a guide mechanism on the base comprising opposed channels configured to engage the sides of the clamp to align the force applying mechanism on the base and slots configured to engage the tabs to attach the clamp to the base;
   the base, the terminal contact protector and the guide mechanism comprising a molded plastic unitary structure.

27. The test carrier of claim 26 wherein the channels are configured to move the sides of the clamp towards one another.

28. The test carrier of claim 26 wherein the terminal contact protector substantially encloses the terminal contacts.

29. The test carrier of claim 26 wherein the guide mechanism comprises a pair of second slots for releasing the tabs.

30. A method for testing a semiconductor component comprising:
   providing a test carrier comprising a base, an interconnect for making temporary electrical connections with the component, a force applying mechanism for biasing the component and the interconnect together, and a guide mechanism for aligning the force applying mechanism on the base;
   the force applying mechanism comprising a clamp having opposed sides, tabs on the sides, and a spring on the clamp configured to bias the component and the interconnect together;
   the guide mechanism comprising opposed channels configured to align the clamp on the base as the clamp is slid along the channels and to move the sides of the clamp towards one another, and a pair of slots proximate to the channels configured to engage the tabs to attach the clamp to the guide mechanism;
   aligning and attaching the force applying mechanism on the base using the guide mechanism;
   placing the component in contact with the interconnect; and
   applying test signals through the interconnect to the component.

31. The method of claim 30 wherein the base and the guide mechanism comprise a molded plastic unitary structure.

32. The method of claim 30 wherein the guide mechanism comprises a cavity for enclosing the force applying mechanism.

33. The method of claim 30 wherein the guide mechanism comprises a second pair of slots proximate to the channels configured to release the force applying mechanism.

34. The method of claim 33 wherein the pair of slots and the second pair of slots are generally perpendicular.

35. The method of claim 30 wherein the base comprises a plurality of terminal contacts and a terminal contact protector for protecting the terminal contacts.

36. A method for testing a semiconductor component having a plurality of first contacts comprising:
   providing a test carrier comprising:
      a molded plastic base,
      an interconnect on the base comprising a plurality of second contacts configured to make temporary electrical connections with the first contacts on the component,
      a force applying mechanism comprising a clamp having opposed sides and a spring for biasing the component and the interconnect together, and
      a guide mechanism molded on the base to form a unitary structure comprising opposed channels configured to engage the sides of the clamp during assembly of the test carrier to align the force applying mechanism on the base;
   assembling the test carrier using the guide mechanism to align the force applying mechanism on the base; and
   applying test signals through the second contacts on the interconnect to the first contacts on the component.

37. The method of claim 36 wherein the assembling step comprises a step of aligning the component to the interconnect.

38. The method of claim 36 wherein the base comprises a plurality of terminal contacts in electrical communication with the second contacts and a molded plastic terminal contact protector.

39. The method of claim 36 wherein the force applying mechanism comprises tabs on the sides and the guide mechanism comprises slots for retaining the tabs.

40. The method of claim 39 wherein the guide mechanism comprises second slots for releasing the tabs.

41. A method for testing a semiconductor component comprising:
   providing a test carrier comprising:
      a base,
      an interconnect on the base comprising a plurality of first contacts for making temporary electrical connections with a plurality of second contacts on the component,
      a force applying mechanism on the base comprising a clamp and a spring for biasing the component and the interconnect together, and
      a guide mechanism on the base for aligning the force applying mechanism with respect to the interconnect during assembly of the test carrier, the guide mechanism comprising a cavity for substantially enclosing the force applying, a guide channel for engaging the clamp, a first slot for attaching the clamp to the guide mechanism and a second slot for releasing the clamp from the guide mechanism;
   attaching the clamp to the base using the guide channel to align the force applying mechanism, the cavity to protect the force applying mechanism, and the first slot to attach the force applying mechanism to the guide mechanism;
   applying test signals through the interconnect to the component; and
   detaching the force applying mechanism from the guide mechanism using the second slot.

42. The method of claim 41 further comprising providing the base with a plurality of terminal contacts in electrical communication with the first contacts and a protector for protecting the terminal contacts.

43. The method of claim 41 further comprising providing the base with a plurality of terminal contacts in electrical communication with the first contacts and a protector for aligning the terminal contacts with a test board.

44. A system for testing a semiconductor component having a plurality of first contacts comprising:
   a test board in electrical communication with test circuitry configured to generate and analyze test signals;
   a test carrier configured to package and electrically connect the component to the test board, the test carrier comprising:
   a base;
   an interconnect on the base comprising a plurality of second contacts configured to make temporary electrical connections with the first contacts on the component;
   a force applying mechanism comprising a clamp having opposed sides, tabs on the sides, and a spring on the clamp configured to bias the component and the interconnect together; and
   a guide mechanism on the base comprising opposed channels configured to align the clamp on the base as the clamp is slid along the channels and to move the sides of the clamp towards one another, and a pair of slots proximate to the channels configured to engage the tabs to attach the clamp to the guide mechanism.

45. The system of claim 44 wherein the base comprises a plurality of terminal contacts in electrical communication with the second contacts and a terminal contact protector for protecting the terminal contacts.

46. The system of claim 44 wherein the base comprises a plurality of terminal contacts in electrical communication with the second contacts and a terminal contact protector for aligning the terminal contacts to mating contacts on the test board.

* * * * *